United States Patent
Baker, Jr. et al.

(10) Patent No.: US 9,318,158 B2
(45) Date of Patent: Apr. 19, 2016

(54) NON-VOLATILE MEMORY USING BI-DIRECTIONAL RESISTIVE ELEMENTS

(71) Applicants: Frank K. Baker, Jr., Austin, TX (US); Perry H. Pelley, Austin, TX (US); Ravindraraj Ramaraju, Round Rock, TX (US)

(72) Inventors: Frank K. Baker, Jr., Austin, TX (US); Perry H. Pelley, Austin, TX (US); Ravindraraj Ramaraju, Round Rock, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/287,463

(22) Filed: May 27, 2014

(65) Prior Publication Data
US 2015/0348595 A1 Dec. 3, 2015

(51) Int. Cl.
*G11C 11/00* (2006.01)
*G11C 5/06* (2006.01)
*G11C 13/00* (2006.01)

(52) U.S. Cl.
CPC ............. *G11C 5/06* (2013.01); *G11C 13/004* (2013.01); *G11C 13/0069* (2013.01); *G11C 13/0021* (2013.01); *G11C 2213/79* (2013.01)

(58) Field of Classification Search
CPC ..... G11C 5/06; G11C 13/004; G11C 13/0069
USPC .......................................................... 365/72
See application file for complete search history.

(56) References Cited

U.S. PATENT DOCUMENTS

| | | | |
|---|---|---|---|
| 4,809,225 A | 2/1989 | Dimmler et al. | |
| 4,980,859 A | 12/1990 | Guterman et al. | |
| 6,980,459 B2 | 12/2005 | Seshadri et al. | |
| 7,079,415 B2 | 7/2006 | Frey | |
| 8,331,130 B2* | 12/2012 | Yasuda | G11C 13/0007 365/148 |
| 8,441,829 B2* | 5/2013 | Huang et al. | 365/49.11 |
| 8,456,892 B2* | 6/2013 | Yasuda | 365/148 |
| 8,605,490 B2 | 12/2013 | Fackenthal | |
| 8,754,671 B2* | 6/2014 | Nazarian et al. | 326/41 |
| 8,976,573 B2* | 3/2015 | Liaw | 365/154 |
| 9,054,702 B2* | 6/2015 | Nazarian et al. | |
| 2010/0315862 A1* | 12/2010 | Huang et al. | 365/156 |
| 2011/0205780 A1* | 8/2011 | Yasuda | G11C 13/0007 365/148 |
| 2012/0075910 A1* | 3/2012 | Yasuda | 365/148 |

(Continued)

FOREIGN PATENT DOCUMENTS

| | | |
|---|---|---|
| JP | 60144977 A | 7/1985 |
| JP | 2002109875 A | 4/2002 |

(Continued)

OTHER PUBLICATIONS

Chang, MF., et al., "Circuit Design Challenges in Embedded Memory and Resistive RAM (RRAM) for Mobile SoC and 3D-IC", IEEE, 2D-1, Aug. 2011, pp. 197-203.

(Continued)

*Primary Examiner* — Richard Elms
*Assistant Examiner* — Xiaochun L Chen (57) ABSTRACT

A memory cell includes a first bi-directional resistive element having a cathode coupled to a first power rail and an anode coupled to an internal node, a second bi-directional resistive element having a cathode coupled to the internal node and an anode coupled to a second power rail, and a first transistor having a control electrode coupled to the internal node, a first current electrode coupled to a first bitline, and a second current electrode coupled to a third power rail.

13 Claims, 5 Drawing Sheets

(56) References Cited

U.S. PATENT DOCUMENTS

| | | | |
|---|---|---|---|
| 2013/0027079 A1* | 1/2013 | Nazarian et al. | 326/41 |
| 2013/0272056 A1* | 10/2013 | Liaw | 365/154 |

FOREIGN PATENT DOCUMENTS

| | | |
|---|---|---|
| JP | 2011081896 A | 4/2011 |
| KR | 20020002823 A | 1/2002 |

OTHER PUBLICATIONS

Ohsawa, T., et al., "1Mb 4T-2MTJ Nonvolatile STT-RAM for Embedded Memories Using 32b Fine-Grained Power Gating Technique with 1.0ns/200ps Wake-up/Power-off Times", 2012 Symposium on VLSI Circuits Digest of Technical Papers, Jun. 2012, pp. 46-47.

Butcher, B., et al., "Hot Forming to Improve Memory Window and Uniformity of Low-Power HfOx-Based RRAMS", IEEE 4th International Memory Workshop in Milan, Italy, May 20-23, 2012, pp. 1-4.

Worledge, D.C., et al., "Recent Advances in Spin Torque MRAM", IEEE, Sep. 2012, pp. 1-3.

Hayakawa, J., et al., "Current-Driven Magnetization Switching in CoFeB/MgO/CoFeB Magnetic Tunnel Junctions", Japanese Journal of Applied Physics, vol. 44, No. 41, 2005, pp. L1267-L1270.

\* cited by examiner

NON-VOLATILE MEMORY USING BI-DIRECTIONAL RESISTIVE ELEMENTS

BACKGROUND

1. Field of the Disclosure

The present disclosure relates in general to non-volatile memories, and more specifically to systems and methods for non-volatile memory that use bi-directional resistive elements.

2. Description of the Related Art

Memories with resistive storage elements are under development across the semiconductor industry that are geared to replace conventional random access memory (RAM) and non-volatile memory devices. The resistive memory devices include magnetoresistive random access memory (MRAM), Resistive random-access memory (RRAM or ReRAM), phase-change memory (PCM), among others. Most of the resistive memory devices are implemented in one transistor/one resistive element or one diode/one resistive element memory cell configurations, which provide minimal cell area but exhibit relatively slow read and write performance (e.g., approximately 30 nanoseconds or more per operation). Thus, resistive memory devices are not a viable substitute for much of the static RAM in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future SoCs, but it is desirable to use these same elements to replace the static random access memory (SRAM) as well. Potentially, less flash would be needed, or the system could use a more efficient architecture, if the 'fast' memory such as SRAM was also compact and non-volatile.

BRIEF DESCRIPTION OF THE DRAWINGS

The benefits, features, and advantages of the present disclosure will become better understood with regard to the following description, and accompanying drawings where.

DETAILED DESCRIPTION

Integrated circuit devices and methods are disclosed that utilize resistive storage elements operating bi-directionally as non-volatile storage with read speeds and space requirements comparable to conventional six transistor SRAM. One resistive element is in a high resistive state (HRS) while the other resistive element is in a low LRS, and the comparison of the two resistive elements produces a robust zero or one logic state to be sensed. The memory cells include a series pair of resistive elements connected between two column-wise power supplies (VDDC and VSSC). The elements are connected such that they can be 'programmed' to HRS and LRS simultaneously. The resistive elements are wired with opposite orientation to each other to enable transition from HRS to LRS, or from LRS to HRS simultaneously. The cells also include a write transistor connected to a bitline and controlled by a write wordline, and a two-transistor read circuit actuated by a read wordline, connecting the read circuit to the bitline.

Figure 1:
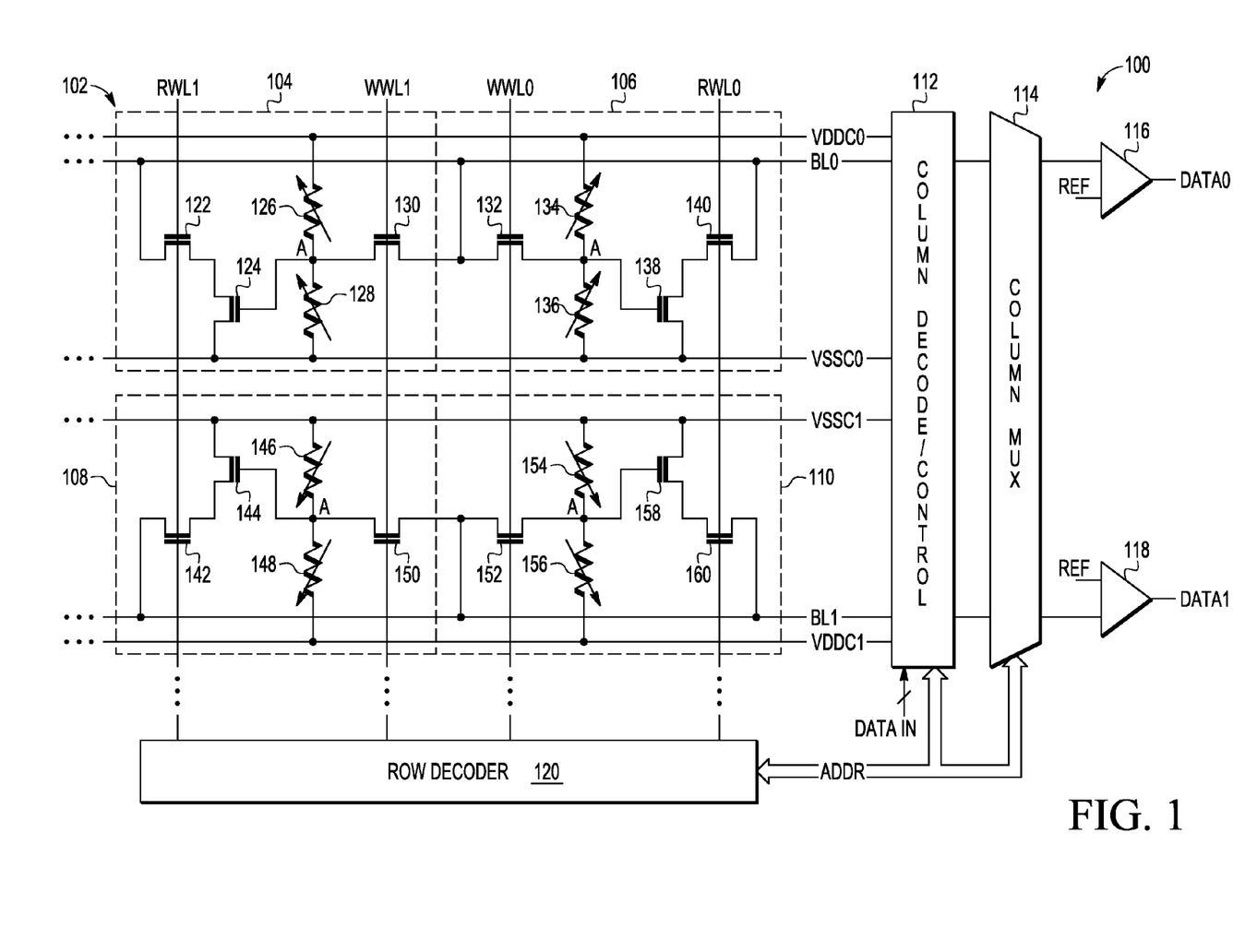
FIG. 1 is a schematic diagram of an integrated circuit device including a non-volatile memory (NVM) according to one embodiment.

FIG. 1 is a block diagram of an integrated circuit device including a non-volatile memory (NVM) device 100 according to one embodiment. NVM device 100 includes NVM array 102 with a plurality of memory cells 104, 106, 108, 110 coupled to column decode/control 112, column multiplexer 114, sense amplifiers 116, 118, and row decoder 120. Sense amplifiers 116, 118 are coupled to column decode/control 112 by column multiplexer 114. Row decoder 120, column decode/control 112, and column multiplexer 114 can receive addresses for read and write requests from a computer processor (not shown). Data to be written to memory array 102 is provided from a processor to column decode/control 112. Read wordlines $RWL_{0-1}$ and write wordlines $WWL_{0-1}$ are coupled between row decoder 120 and memory array 102. Although device 100 is shown with four memory cells 104-110, two read and write wordlines and two bitlines, device 100 can include any suitable number of memory cells, wordlines and bitlines.

An NVM controller (not shown) controls program and erase procedures of the NVM array 102 through row decoder 120 and column decode/control 112, such as in response to one or more processors. Data is written into or read from the NVM array 102 via column decode/control 112.

Bitlines $BL_{0-1}$ are coupled between memory array 102 and column decode/control 112, and between sense amplifiers 116, 118 and column decode/control 112 by way of column multiplexer 114. Sense amplifiers 116, 118 provide data from memory array 106 to one or more processors.

NVM device 100 may be implemented as part of a System On Chip (SOC) or the like which includes at least one processor coupled to the NVM device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the NVM device 100 is implemented alone in an integrated circuit without any other devices. In another alternative embodiment, NVM device 100 is part of a larger system on the integrated circuit.

Memory cell 104 includes first and second N-channel access transistors 122, 130, two bidirectional resistive elements 126, 128 and N-channel discharge or pull-down transistor 124. Access transistor 122 has a drain electrode coupled to bitline BL0, a source electrode coupled to a drain electrode of pull-down transistor 124, and a gate electrode coupled to read wordline RWL1. Access transistor 130 has a drain electrode coupled to bitline BL0, a source electrode coupled to data storage node A, and a gate electrode coupled to write wordline WWL1. Access transistor 124 has a drain electrode coupled to the source electrode of access transistor 122, a source electrode coupled to voltage supply VSSC0 (also referred to herein as a power rail), and a gate electrode coupled to data storage node A. Resistive element 126 has a cathode terminal coupled to voltage supply VDDC0 (also referred to herein as a power rail) and an anode terminal coupled to storage node A. Resistive element 128 has a cathode terminal coupled to storage node A and an anode terminal coupled to voltage supply VSSC0.

Memory cell 106 includes first and second N-channel access transistors 132, 140, two bidirectional resistive elements 134, 136 and N-channel discharge or pull-down transistor 138. Access transistor 132 has a drain electrode coupled to bitline BL0, a source electrode coupled to data storage node A, and a gate electrode coupled to write wordline WWL0. Access transistor 140 has a drain electrode coupled to bitline BL0, a source electrode coupled to a drain electrode of pull-down transistor 138, and a gate electrode coupled to read wordline RWL0. Discharge or pull-down transistor 138 has a drain electrode coupled to the source electrode of access transistor 140, a source electrode coupled to power supply VSSC0, and a gate electrode coupled to data storage node A. Resistive element 134 has a cathode terminal coupled to a voltage supply VDDC0 and an anode terminal coupled to storage node A. Resistive element 136 has a cathode terminal coupled to storage node A and an anode terminal coupled to voltage supply VSSC0.

Memory cell 108 includes first and second N-channel access transistors 142, 150, two bidirectional resistive elements 148, 146 and N-channel discharge or pull-down transistor 144. Access transistor 142 has a drain electrode coupled to bitline BL1, a source electrode coupled to a drain electrode of pull-down transistor 144, and a gate electrode coupled to read wordline RWL1. Access transistor 150 has a drain electrode coupled to bitline BL1, a source electrode coupled to data storage node A, and a gate electrode coupled to write wordline WWL1. Discharge transistor 144 has a drain electrode coupled to the source electrode of access transistor 142, a source electrode coupled to voltage supply VSSC1, and a gate electrode coupled to data storage node A. Resistive element 148 has a cathode terminal coupled to voltage supply VDDC1 and an anode terminal coupled to storage node A. Resistive element 146 has a cathode terminal coupled to storage node A and an anode terminal coupled to voltage supply VSSC1.

Memory cell 110 includes first and second N-channel access transistors 152, 160, two bidirectional resistive elements 156, 154 and N-channel discharge or pull-down transistor 158. Access transistor 152 has a drain electrode coupled to bitline BL1, a source electrode coupled to data storage node A, and a gate electrode coupled to write wordline WWL0. Access transistor 160 has a drain electrode coupled to bitline BL1, a source electrode coupled to a drain electrode of pull-down transistor 158, and a gate electrode coupled to read wordline RWL0. Discharge or pull-down transistor 158 has a drain electrode coupled to the source electrode of access transistor 160, a source electrode coupled to power supply VSSC1, and a gate electrode coupled to data storage node A. Resistive element 156 has a cathode terminal coupled to a voltage supply VDDC1 and an anode terminal coupled to storage node A. Resistive element 154 has a cathode terminal coupled to storage node A and an anode terminal coupled to voltage supply VSSC1.

Bi-directional resistive elements 126/128, 134/136, 146/148 and 154-156 are used as nonvolatile storage for the data in memory cells 104-110. The anode of resistive elements 128, 136, 146, 154 is connected to a respective one of voltage supply VDDC0, VDDC1, while the anode of resistive elements 126, 134, 148, 156 is connected to a respective storage node A. As used here, the term 'anode' refers to the node which is biased positive to switch from a high resistive state (HRS) to a low resistive state (LRS). If a storage node A is pulled to ground by a respective write wordline (WWL0, WWL1) and VDDC/VSSC are taken positive (e.g., 2 Volts), resistive elements 128, 136, 146, 154 will be biased to switch from HRS to LRS, while resistive elements 126, 134, 148, 156 will switch from LRS to HRS.

Figure 2:
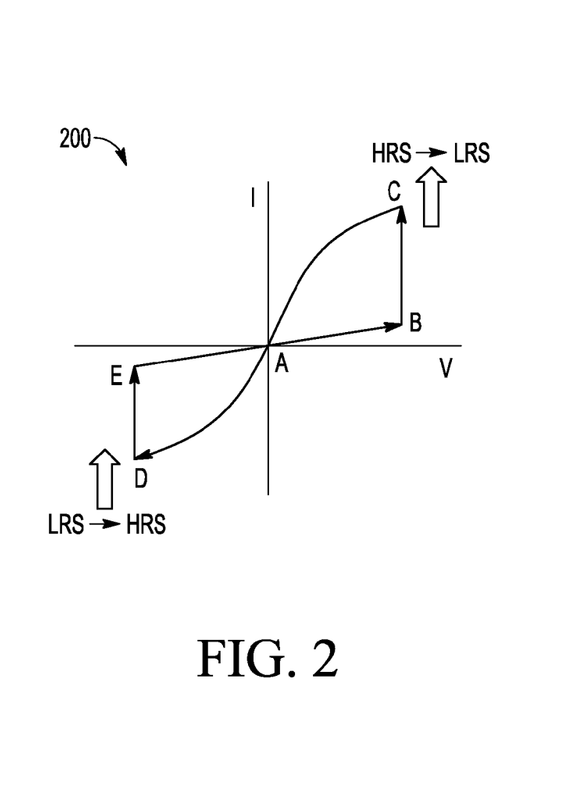
FIG. 2 is a diagram showing states of a resistive element of a memory cell in the memory array of FIG. 1 in accordance with one embodiment.

FIG. 2 is a diagram showing states of a resistive element, for example resistive element 126, of memory cell 104 in the memory array 102 of FIG. 1 in accordance with one embodiment. In state A, the current and voltage are approximately zero, and the resistance is in a high resistive state (HRS). As voltage increases along the positive x-axis, the current remains low until the voltage reaches a level at state B that causes the resistive element 126 to shift from a HRS to a low resistive state (LRS) at state C. With resistive element 126 in LRS, current varies monotonically with voltage and may not be linearly proportional. In the diagram shown, as voltage decreases to a negative value at state D, current has also decreased to a negative value. At state D, the voltage and current reach a level that causes resistive element 126 to change from a LRS to HRS, shown as state E in FIG. 3. With resistive element 126 in the HRS, current barely changes with increases in voltage, as shown with current remaining close to zero along the y-axis as voltage varies from a lowest to a highest value from state E to state A, and from state A to state B.

Figure 3:
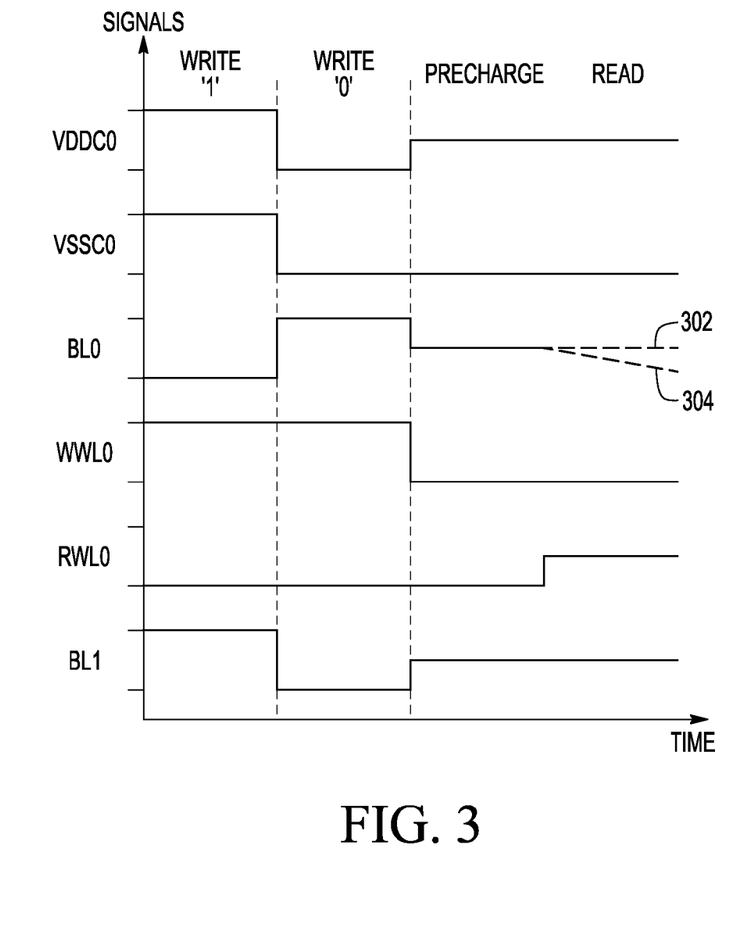
FIG. 3 is a timing diagram showing states of signals in a memory cell that may be used in the memory array of FIG. 1 during write, pre-charge and read operations in accordance with one embodiment.

FIG. 3 is a timing diagram showing states of signals in a memory cell that may be used in the memory array of FIG. 1 during write, pre-charge and read operations in accordance with one embodiment. Note that while write "1", write "0", precharge, and read states are shown as starting immediately after the previous state ends, it is likely some time will pass between states and the various signals VDDC0, VSSC0, BL0, WWL0, RWL0 and BL1 may take different intermediate values during time intervals between states that are not shown in FIG. 3.

Referring to FIGS. 1 and 3, to write a "1" in a selected memory cell 106, FIG. 3 shows the bitline (BL0) is grounded, first write wordline WWL0 is turned on and VDDC0/VSSC0 are taken to supply voltage, for example, 2 Volts. This will switch resistive element 134 from HRS to LRS, and resistive element 136 from LRS to HRS.

To write a "0" in a selected memory cell 106, bitline BL0 is taken to the high voltage VDDC0, for example, 2 Volts. Write wordline WWL0 is turned on, and VDDC0/VSSC0 are grounded, which will switch resistive element 134 from LRS to HRS, and resistive element 136 from HRS to LRS. The data storage state is determined by the voltage divider created by the two resistive elements 134, 136. Typically, HRS is about ten times higher than LRS, so if VDDC0/VSSC0 are biased to 1V/0V, the internal node will float to less than 100 milliVolt or greater than 900 milliVolt, depending on which resistive element 134, 136 is in the LRS and which is in the HRS.

To read memory cell 106, VDDC0 can be set to a fraction of the full supply voltage VDD, such as one-half VDD (for example, one Volt) and VSSC0 can be set to zero Volts. Write wordline WWL0 is grounded, BL0 is precharged to a fraction of the full supply voltage, such as one-half VDD (for example, one Volt), and read wordline RWL0 is biased to a fraction of the full supply voltage, such as one-half VDD (for example, one Volt). If the internal node A is near the VDDC level of one Volt, bitline BL0 is pulled down quickly as shown by dotted line 304 in FIG. 3. If node A remains near the VSSC0 level of zero Volts, bitline BL0 will remain around the precharge level, as shown by dotted line 302 in FIG. 3, allowing the data state at node A to be sensed. Transistors 138 and 140 draw a current from bitline BL0 based on a difference in resistance between the first and second bi-directional resistive elements 134, 136.

Note that all bits on a (local) column share the same VDDC0/VSSC0 lines, so during read operations, the non-selected bits will cause a leakage current between VDDC0 and VSSC0. This does not interfere with the read (to first order) but can consume extra current. The resistance of the element programmed to HRS in each cell will determine the leakage current. Some RRAM technologies achieve about one Mega-ohm (M-ohm) for the HRS, so the leakage current would be around one micro-Ampere (μA) per bit, allowing, for example, 128 bits on a local column segment (sharing VDDC0/VSSC0) while limiting the leakage current to around 100 μA. Other RRAM technologies have HRS in the 10-100 M-ohm range, in which case the leakage would not be a problem. Although FIG. 3 shows fractional supply voltage (e.g. ½ VDDC0) being used during pre-charge and read operations, fully supply voltage VDDC0 can be used instead. The embodiment of memory device 100 shown in FIG. 1 includes dedicated voltage supplies VDDC and VSSC for each column of memory cells 104-110.

Figure 4:
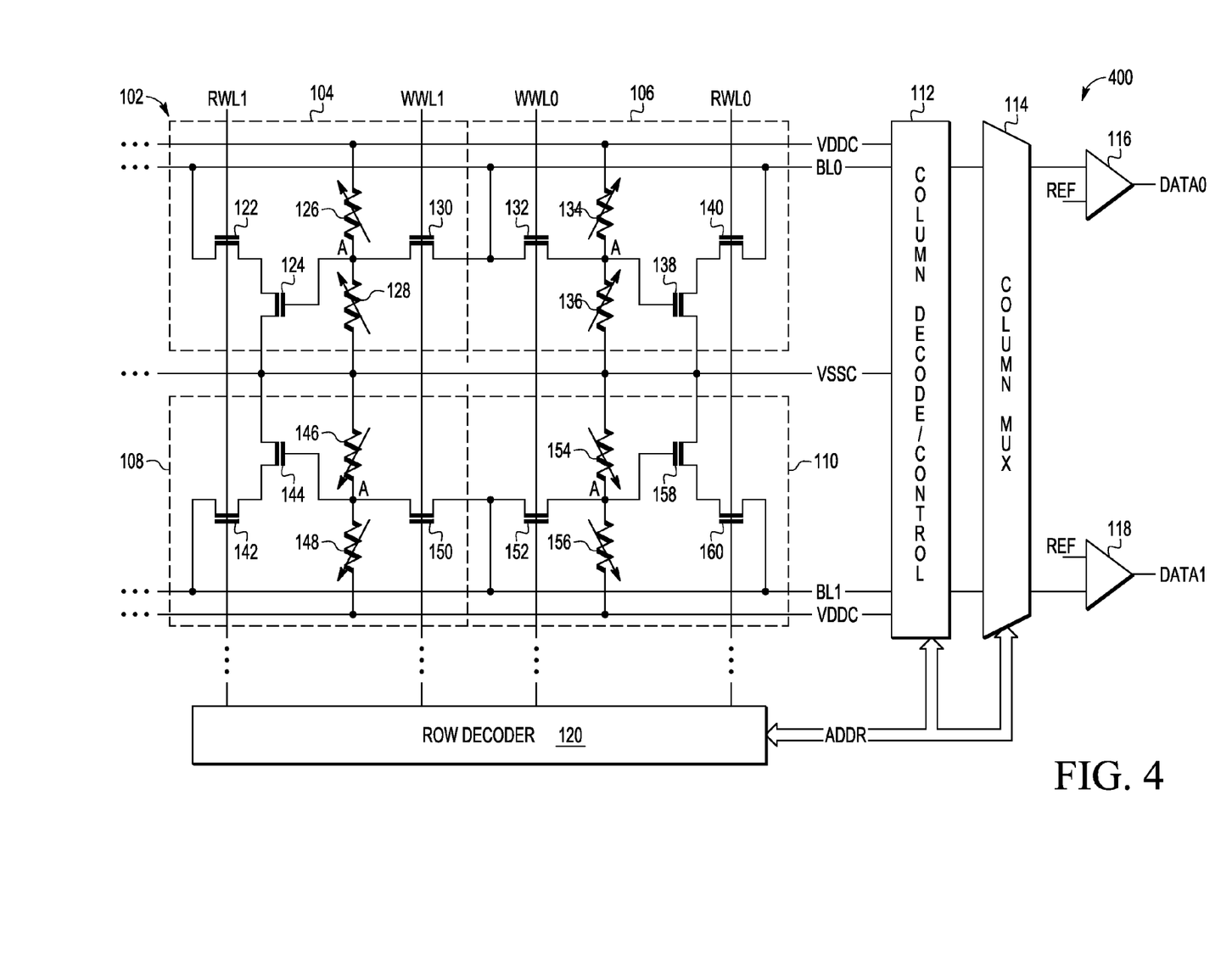
FIG. 4 is a schematic diagram of an integrated circuit device including a non-volatile memory (NVM) according to another embodiment.

Referring now to FIG. 4, memory device 400 is shown with memory cells 104-110 having a structure and function that is similar to memory cells 104-110 shown in and described for FIG. 1 with the exception that the same voltage supplies VDDC and VSSC are shared by adjacent columns of cells, instead of using dedicated VDDC0/VDDC1 and VSSC0/VSSC1 for respective columns of memory cells.

In some cases, the voltage supplied to write wordlines WWL may be increased to account for the loss due to the threshold voltage drop across access transistors 122, 140, 142 and 160. Alternatively, a zero threshold voltage transistor can be used for access transistors 122, 140, 142 and 160. In other implementations, bitlines BL0, BL1 may be segmented to avoid current loss in non-selected bits.

Figure 5:
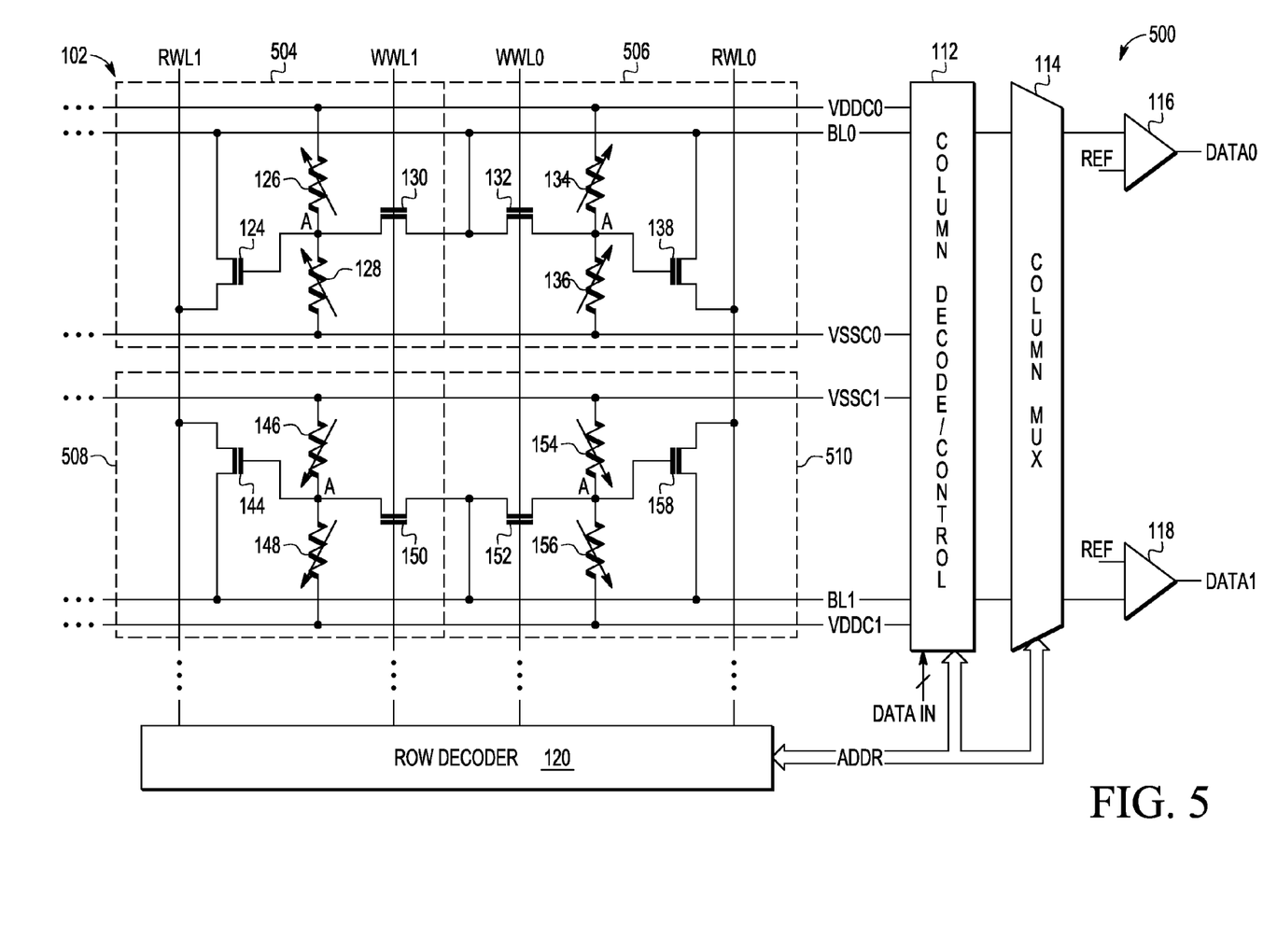
FIG. 5 is a schematic diagram of an integrated circuit device including a non-volatile memory (NVM) according to yet another embodiment.

Referring now to FIG. 5, integrated circuit or memory device 500 is shown with memory cells 504-510 having a structure and function that is similar to memory cells 104-110 shown in and described for FIG. 1 with the exception that transistors 122, 140, 142 and 160 shown in FIG. 1 are removed. The drain electrodes of transistors 124, 138, 144 and 158 are now connected directly to respective bitlines BL0 and BL1 and the source electrodes of transistors 124, 138, 144 and 158 are now connected to respective read wordlines RWL0 and RWL1. In some implementations, using a read wordline or complementary read wordline voltage instead of VSSC may require biasing VDDC to a voltage below VDD during read operations to control the bitline current through transistors 124, 138, 144 and 158 supplied by the read wordline.

Figure 6:
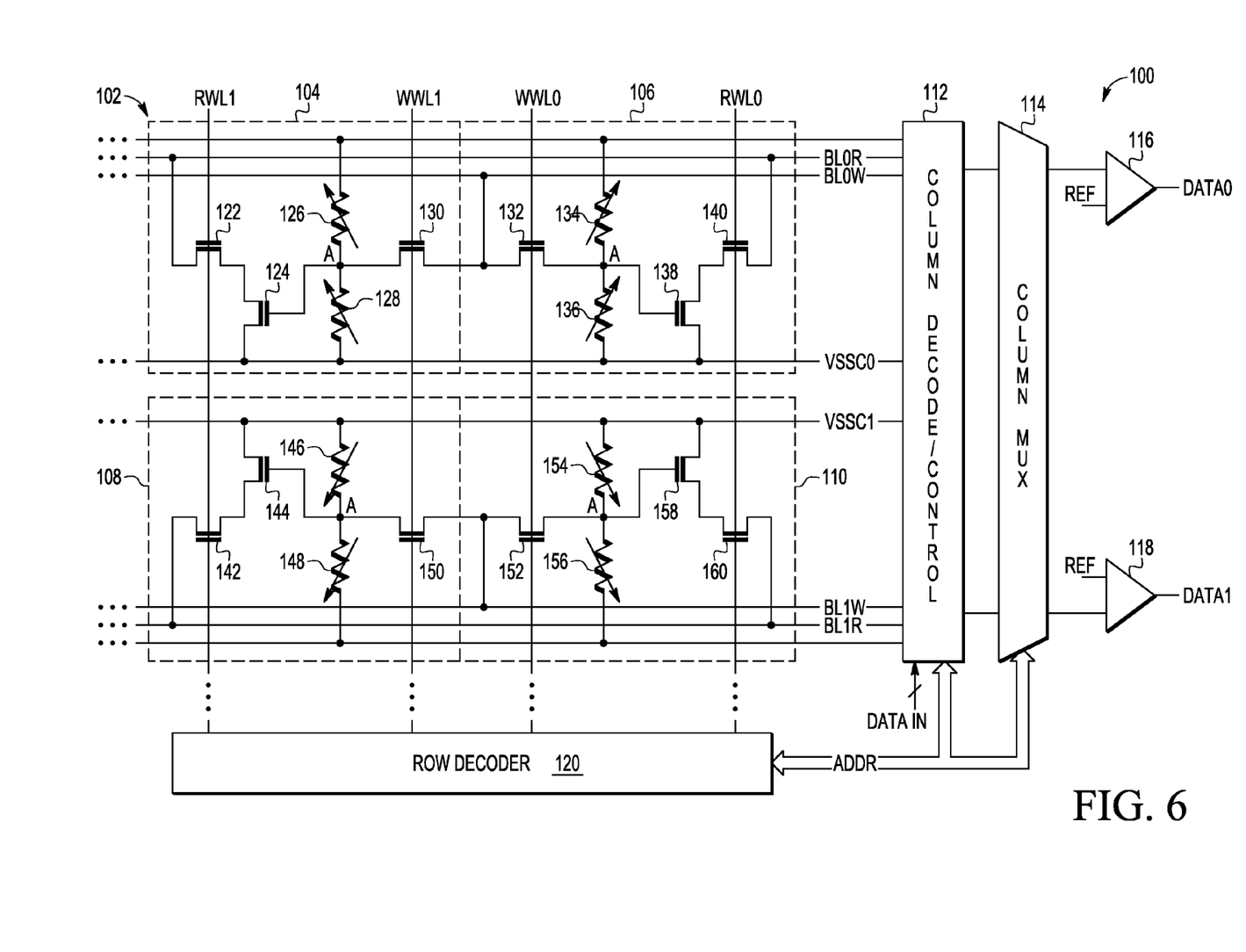
FIG. 6 is a schematic diagram of an integrated circuit device including a non-volatile memory (NVM) according to yet another embodiment.

FIG. 6 is a schematic diagram of dual port integrated circuit or memory device 600 having a structure and function that is similar to memory cells 104-110 shown in and described for FIG. 1 with the exception that memory cells 104, 106, 108, 110 are coupled to respective read bitlines (BL0R, BL1R) and write bitlines (BL0W, BL1W) instead of just one respective bitline (BL0, BL1) as shown in FIG. 1. In particular, drain electrodes of transistors 130, 132 are coupled to a first write bitline BL0W and the drain electrodes of transistors 150, 152 are coupled to a second write bitline BL1W. Drain electrodes of transistors 122, 140 are coupled to a first read bitline BL0R and the drain electrodes of transistors 142, 160 are coupled to a second read bitline BL1R. Separating the bitlines (BL0, BL1) into read and write bitlines (BL0R, BL1R, BL0W, BL1W) allows some cells to be read from using, for example, BL0R, while cells on the same column in the array are written to using, for example, BL0W. This in turn, allows a larger portion of the memory to be available for read operations while a write operation is also in progress.

Notably, the layout area requirements for cells 104-110 are comparable to the area required for conventional SRAM cells while providing the robustness of differential read operations, and nonvolatility. Memory cells 104-110 can be used in extremely low power modes since the resistive elements 126/128, 134/136, 146/148 and 154/156 retain the data while not powered, and thus do not draw leakage current.

By now it should be appreciated that in some embodiments, memory cells can comprise a first bi-directional resistive element (134) having a cathode coupled to a first power rail (VDDC) and an anode coupled to an internal node (A). A second bi-directional resistive element (136) can have a cathode coupled to the internal node and an anode coupled to a second power rail (VSSC). A first transistor (138) can have a control electrode coupled to the internal node, and a first current electrode coupled to a first bitline, and a second current electrode coupled to one of a group consisting of: a read wordline and a third power rail.

In another aspect, when the first bi-directional resistive element has a higher resistance than the second bi-directional resistive element, the memory cell stores a first logic state, and when the first bi-directional resistive element has a lower resistance than the second bi-directional resistive element, the memory cell stores a second logic state.

In another aspect, the memory cell can further comprise a second transistor (140) coupled between the first current electrode of the first transistor and the first bitline. The second transistor can have a first current electrode coupled to the first bitline, a second current electrode coupled to the first current electrode of the first transistor, and a control electrode coupled to the read wordline.

In another aspect, during a read operation, the first transistor can draw a current from the first bitline based on a difference in resistance between the first and second bi-directional resistive elements.

In another aspect, the method can further comprise a third transistor (132) having a first current electrode coupled to a second bitline, a control electrode coupled to a write wordline, and a second current electrode coupled to the internal node.

In another aspect, during a write operation, the first and second bi-directional resistive elements are coupled in parallel.

In another aspect, during the write operation, the third transistor couples the second bitline to the internal node, wherein when a voltage at the internal node is at least a predetermined amount greater than a voltage of the first and second power rails, a first logic state is written to the memory cell and when the voltage at the internal node is at least the predetermined amount less than the voltage of the first and second power rails, a second logic state is written to the memory cell.

In another aspect, the first bitline and the second bitline can be a same bitline.

In another aspect, one of a group consisting of the second and third power rails, and the first and third power rails, are a same power rail.

In other embodiments, a method of operating a memory cell having a first bi-directional resistive element (134) having a cathode coupled to a first power rail (VDDC) and an anode coupled to an internal node (A), and a second bi-directional resistive element (136) having a cathode coupled to the internal node and an anode coupled to a second power rail (VSSC), can comprise, during a read operation, coupling the first and second bi-directional resistive elements in series between the first power rail and the second power rail, and coupling the internal node to a control electrode of a pull-down transistor configured to draw current from a first bitline based on a difference in resistance between the first and second bi-directional resistive elements. During a write operation, the internal node can be coupled to a second bitline, the first power rail can be set to a first voltage different from a voltage of the second bitline, and the second power rail can be set to a second voltage different from the voltage of the second bitline.

In another aspect, during the write operation, the first voltage can be a same voltage as the second voltage.

In another aspect, during the write operation, a polarity between the voltage of the second bitline and the first power rail can be a same polarity as a polarity between the voltage of the second bitline and the second power rail.

In another aspect, the first bitline and the second bitline can be a same bitline.

In another aspect, during the write operation, when a voltage at the internal node is at least a predetermined amount greater than the first voltage and at least a predetermined amount greater than the second voltage, the method can further comprise writing a first logic state to the memory cell, and when the voltage at the internal node is at least a predetermined amount lower than the first voltage and at least a predetermined amount lower than the second voltage, the method can comprise writing a second logic state to the memory cell.

In another aspect, the method can further comprise, during the read operation, sensing the first bitline to determine a logic state stored in the memory cell.

In still further embodiments, a memory can comprise an array of memory cells, wherein each memory cell can comprise a first bi-directional resistive element (134) having a cathode coupled to a first power rail (VDDC) and an anode coupled to an internal node (A), a second bi-directional resistive element (136) having a cathode coupled to the internal node and an anode coupled to a second power rail (VSSC), a first transistor (138) having a control electrode coupled to the internal node, a first current electrode, and a second current electrode coupled to a third power rail, a second transistor (140) having a first current electrode coupled to a first bitline, a second current electrode coupled to the first current electrode of the first transistor, and a control electrode coupled to a read wordline, and a third transistor (132) having a first current electrode coupled to a second bitline, a control electrode coupled to a write wordline, and a second current electrode coupled to the internal node. Column decode and sense circuitry can be coupled to the first bitline of each memory cell of the array of memory cells; and row decode circuitry can be coupled to the read and write wordlines of each memory cell of the array of memory cells.

In another aspect, during a read operation, for each memory cell coupled to an activated read wordline, the first transistor is configured to draw current from the first bitline based on a difference in resistance between the first and second bi-directional resistive elements, wherein for each memory cell of the array of memory of cells, when the first bi-directional resistive element has a higher resistance than the second bi-directional resistive element, the memory cell stores a first logic state, and when the first bi-directional resistive element has a lower resistance than the second bi-directional resistive element, the memory cell stores a second logic state.

In another aspect, during the write operation, for each memory cell coupled to an activated write wordline, the third transistor couples the second bitline to the internal node, wherein when a voltage at the internal node is at least a predetermined amount greater than a voltage of the first and second power rails, a first logic state is written to the memory cell and when the voltage at the internal node is at least the predetermined amount less than the voltage of the first and second power rails, a second logic state is written to the memory cell.

In another aspect, in each memory cell of the memory array of memory cells, the first bitline and the second bitline are a same bitline, and one of a group consisting of the second and third power rails, and the first and third power rails, are a same power rail.

In another aspect, at least one of the first power rail and the second power rail is shared between adjacent columns of the array of memory cells.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A memory cell comprising:
 a first bi-directional resistive element having a cathode coupled to a first power rail and an anode coupled to an internal node;
 a second bi-directional resistive element having a cathode coupled to the internal node and an anode coupled to a second power rail;
 a first transistor having a control electrode coupled to the internal node, and a first current electrode coupled to a first bitline, and a second current electrode coupled to one of a group consisting of: a read wordline and a third power rail;
 a column decode and control circuit configured to apply a same voltage to the first and second power rails during a write operation while the internal node is at a different voltage than the same voltage;
 a second transistor coupled between the first current electrode of the first transistor and the first bitline, the second transistor having a first current electrode coupled to the first bitline, a second current electrode coupled to the first current electrode of the first transistor, and a control electrode coupled to the read wordline;
 a third transistor having a first current electrode coupled to a second bitline, a control electrode coupled to a write wordline, and a second current electrode coupled to the internal node, wherein the first bitline and the second bitline are a same bitline.

2. The memory cell of claim 1, wherein when the first bi-directional resistive element has a higher resistance than the second bi-directional resistive element, the memory cell stores a first logic state, and when the first bi-directional resistive element has a lower resistance than the second bi-directional resistive element, the memory cell stores a second logic state.

3. The memory cell of claim 1, wherein, during a read operation, the first transistor draws a current from the first bitline based on a difference in resistance between the first and second bi-directional resistive elements.

4. The memory cell of claim 1, wherein, during the write operation, the first and second bi-directional resistive elements are written simultaneously due to the first and second bi-directional resistive elements being effectively coupled in parallel by the same voltage being set at the first and second power rails.

5. The memory cell of claim 4, wherein during the write operation, the third transistor couples the second bitline to the internal node, wherein when the different voltage at the internal node is at least a predetermined amount greater than the same voltage of the first and second power rails, a first logic state is written to the memory cell and when the different voltage at the internal node is at least the predetermined amount less than the same voltage of the first and second power rails, a second logic state is written to the memory cell.

6. The memory cell of claim 1, wherein one of a group consisting of the second and third power rails are a same power rail, and the first and third power rails are a same power rail.

7. A method of operating a memory cell having a first bi-directional resistive element having a cathode coupled to a first power rail and an anode coupled to an internal node, and a second bi-directional resistive element having a cathode coupled to the internal node and an anode coupled to a second power rail, the method comprising:

during a read operation:
  coupling the first and second bi-directional resistive elements in series between the first power rail and the second power rail, and
  coupling the internal node to a control electrode of a pull-down transistor configured to draw current from a first bitline based on a difference in resistance between the first and second bi-directional resistive elements; and
 during a write operation:
  coupling the internal node to a second bitline, wherein the first bitline and the second bitline are a same bitline,
  setting the first power rail to a first voltage different from a voltage of the second bitline, and
  setting the second power rail to the first voltage.

8. The method of claim 7, wherein, during the write operation, a polarity between the voltage of the second bitline and the first power rail is a same polarity as a polarity between the voltage of the second bitline and the second power rail.

9. The method of claim 7, wherein during the write operation, when a voltage at the internal node is at least a predetermined amount greater than the first voltage, the method comprises writing a first logic state to the memory cell, and when the voltage at the internal node is at least a predetermined amount lower than the first voltage, the method comprises writing a second logic state to the memory cell.

10. The method of claim 7, further comprising, during the read operation, sensing the first bitline to determine a logic state stored in the memory cell.

11. A memory comprising:
 an array of memory cells, wherein each memory cell comprises:
  a first bi-directional resistive element having a cathode coupled to a first power rail and an anode coupled to an internal node;
  a second bi-directional resistive element having a cathode coupled to the internal node and an anode coupled to a second power rail;
  a first transistor having a control electrode coupled to the internal node, a first current electrode, and a second current electrode coupled to a third power rail;
  a second transistor having a first current electrode coupled to a first bitline, a second current electrode coupled to the first current electrode of the first transistor, and a control electrode coupled to a read wordline; and
  a third transistor having a first current electrode coupled to a second bitline, a control electrode coupled to a write wordline, and a second current electrode coupled to the internal node, wherein, in each memory cell of the memory array of memory cells, the first bitline and the second bitline are a same bitline, and one of a group consisting of the second and third power rails are a same power rail, and the first and third power rails are a same power rail;
 column decode circuitry coupled to the first and second power rails, and to the first bitline of each memory cell of the array of memory cells; and
 row decode circuitry coupled to the read and write wordlines of each memory cell of the array of memory cells,
 wherein during a write operation, the column decode circuitry is configured to apply a same voltage to the first and second power rails and a different voltage to the first and second bit lines, and for each memory cell coupled to an activated write wordline, the third transistor couples the second bitline to the internal node, wherein when the different voltage at the internal node is at least a predetermined amount greater than the same voltage of the first and second power rails, a first resistance state is written simultaneously to the first and second bi-directional elements of the memory cell, and when the different voltage at the internal node is at least the predetermined amount less than the same voltage of the first and second power rails, a second resistance state is written simultaneously to the first and second bi-directional elements of the memory cell.

12. The memory of claim 11, wherein, during a read operation, for each memory cell coupled to an activated read wordline, the first transistor is configured to draw current from the first bitline based on a difference in resistance between the first and second bi-directional resistive elements, wherein for each memory cell of the array of memory of cells, when the first bi-directional resistive element has a higher resistance than the second bi-directional resistive element, the memory cell stores a first logic state, and when the first bi-directional resistive element has a lower resistance than the second bi-directional resistive element, the memory cell stores a second logic state.

13. The memory of claim 11, wherein at least one of the first power rail and the second power rail is shared between adjacent columns of the array of memory cells.

* * * * *